United States Patent [19]

Tanaka et al.

[11] Patent Number: 5,170,166
[45] Date of Patent: Dec. 8, 1992

[54] RANGE SWITCHING DEVICE FOR ANALOG TO DIGITAL CONVERSION

[75] Inventors: Masao Tanaka; Shinichi Tomita, both of Sakura; Yoshiharu Unami, Tomisato; Hiroyuki Kawasaki, Chiba, all of Japan

[73] Assignee: Fujikura Ltd., Tokyo, Japan

[21] Appl. No.: 618,181

[22] Filed: Nov. 26, 1990

[51] Int. Cl.⁵ .............................................. H03M 1/18
[52] U.S. Cl. ...................................... 341/139; 341/155
[58] Field of Search .............. 341/139, 131, 132, 118, 341/140, 155, 156, 158, 159, 161, 166, 167, 168

[56] References Cited

U.S. PATENT DOCUMENTS 3,790,886  2/1974  Kurtin et al. ...................... 341/139
3,813,609  5/1974  Wilkes et al. ......................... 330/29
4,485,372  11/1984  Holloway ............................ 341/139
4,827,191  5/1989  Chapman ............................ 341/132

Primary Examiner—Sharon D. Logan
Assistant Examiner—B. K. Young
Attorney, Agent, or Firm—Sprung Horn Kramer & Woods

[57] ABSTRACT

The invented auto-ranging device has a signal measuring A/D converter, a range-switching A/D converter of a faster processing speed, a range-switching amplifier with variable amplification capabilities, and a processing controller which utilizes the variable amplification factors to alter the output signals from the switching A/D converter to generate signals appropriate for a scale range of a multi-range measuring A/D converter.

3 Claims, 1 Drawing Sheet

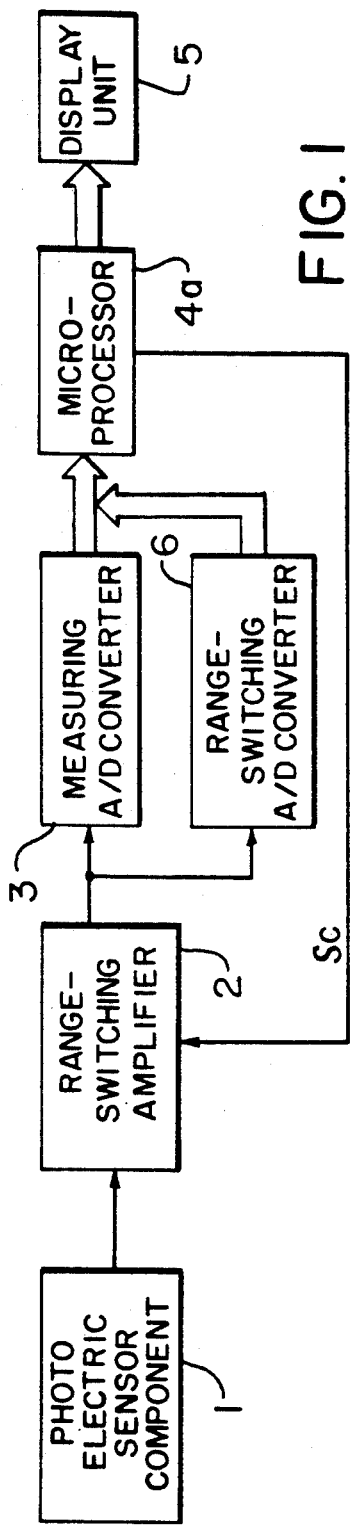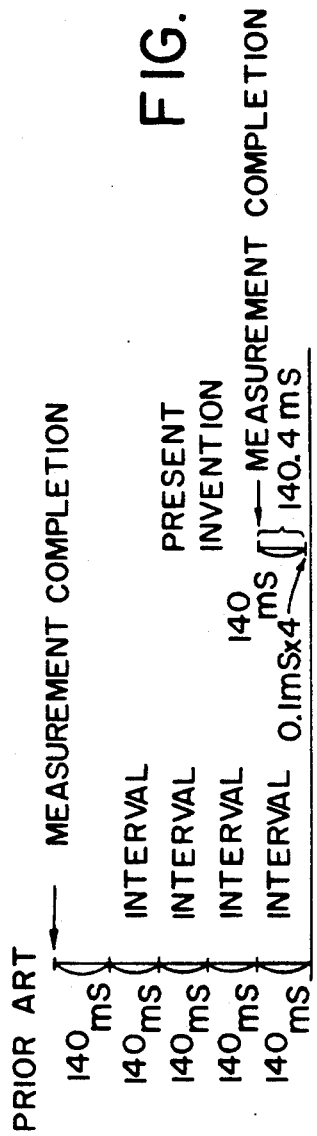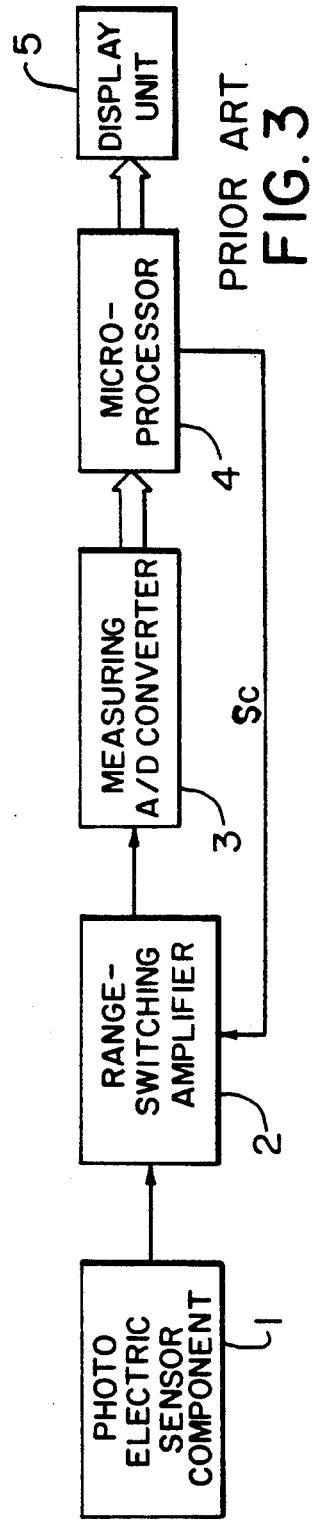

RANGE SWITCHING DEVICE FOR ANALOG TO DIGITAL CONVERSION

FIELD OF THE INVENTION

This invention relates to a range switching device which is particularly applicable to the detection of signal levels generated by such instruments as light-intensity meters and other quick response instruments.

BACKGROUND OF THE INVENTION

Conventional auto-ranging instruments are provided with an internal range switching unit to enable automatic switching of a measured signal so that it can be accommodated within the scale ranges provided on the analogue to digital conversion unit (hereinafter referred to as A/D converter).

Currently available devices employ different techniques for auto-ranging; for example, a U.S. Pat. No. 4,827,191, teaches a technique of measuring the peak values and entering them into the control section of an A/D converter to select an appropriate scale range of a measuring instrument. Another U.S. Pat. No. 3,813,609, discloses a technique of adjusting the level of the measured signal based on the output power of an A/D converter.

However, the technique according to U.S. Pat. No. 4,827,191 is applicable to A/D converters equipped with range-switching capabilities, but not to those without such capability. On the other hand, U.S. Pat. No. 3,813,609 teaches that the time between the reception of a signal and its digital output is primarily governed by the processing speed of A/D conversion. Precision measurements require the use of an A/D converter having a large number of bits, resulting in relatively slow response. In order to shorten the response time, converters such as successive approximation or flash type is required, both of which are relatively expensive, thus making the instruments containing such devices more costly.

The operation of such an A/D conversion unit similar to the one described in the above mentioned U.S. Pat. No. 3,813,609 is described in the following.

FIG. 3 shows a schematic diagram of an instrument having the A/D converter mentioned in the latter patent above. In this instrument, photoelectric sensor component 1, e.g. photodiode, receives light energy and outputs it as electrical energy. The range-switching amplifier 2 for the range-switching unit receives a signal from said component 1 and amplifies the signal according to a preset amplification factor. The range-switching amplifier 2 is set to change the amplification factor according to the magnitude of the supplied signal $S_c$. The measuring A/D converter 3 converts the signal from the range-switching amplifier 2 into a digital form. The microprocessor 4 consists essentially of a CPU, a ROM, a RAM and interface circuits (none of which is shown). A control program for the CPU is stored in the ROM, which also contains data regarding the input range of the measuring A/D converter 3, i.e. the scale range limits.

Microprocessor 4 receives the signal from the A/D converter 3, converts it into numerals and forwards the result to a display unit 5. Microprocessor 4 also generates a control signal to vary the amplification factor of the range-switching amplifier 2 so that its output signal to the A/D converter 3 will be within the input scale range. The microprocessor 4 and the range-switching amplifier 2 constitute the range-switching circuitry.

When the magnitude of the output signal from the amplifier 2 into the A/D converter exceeds the scale range of such a light intensity measuring device, the excess signal overflows from the converter. When the microprocessor 4 receives such an overflow indication, it generates a command signal to decrement the amplification factor of the range-switching amplifier 2. The amplifier 2 changes the amplification factor accordingly by a certain amount. If the microprocessor 4 still senses the overflow signal from the amplifier 2, it outputs another command signal to lower the amplification factor still further. This process is repeated until the cessation of the overflow signal, from the amplifier 2 into the microprocessor 4, indicating that the magnitude of the incoming signal is within the scale range of scale of the A/D converter 3. At this time the microprocessor 4 accepts the data from the converter 3, transforms the data into a numerical form and displays the result on the display unit 5. On the other hand, when a low level signal is received, the microprocessor 4 continues to increase the amplification factor until the signal magnitude reaches a measurable scale range.

As described above, the conventional meters operate by following incremental trial processes of changing the amplification factor of the range-switching amplifier 2 until the data fit into one of the scale ranges of the measuring device.

Such instruments have the following problems. First, the response time of such circuits is necessarily long because the whole process is predicated on successive trials of changing the amplification factor until the results fit into a permissible range. For example, if an integrating-type A/D converter is used, the conversion times can range from several milliseconds to several hundreds of milliseconds, making the total response time well over one second for five trials. If a faster successive approximation-type converter is used, the conversion time could be shortened to several milliseconds. However, such converters are relatively more expensive on the basis of the number of bits.

SUMMARY OF THE INVENTION

The present invention improves on the above mentioned problems, and an objective is to produce a low cost device with quick response time.

An auto-ranging device in this invention comprises the following components:
- a measuring analogue-to-digital (A/D) converter,
- a range-switching A/D converter having a faster processing speed than that of said measuring A/D converter,
- a range-switching amplifier adapted to provide variable amplification factors to its output signals, and
- a controlling means to alter the magnitude of an output signal produced by said range-switching A/D converter, wherein the magnitude of the said output signal is altered so as to be measurable within a range of scale capability of said measuring A/D converter.

According to the invented range-switching device, the signal to the control microprocessor is generated by the range-switching amplifier (hereinafter referred to as switching amplifier) from the range-switching A/D converter (hereinafter referred to as switching converter) which is a faster processing device than the measuring A/D converter. The microprocessor alters the amplification factor of the switching amplifier so that the observed signal data will fit in a proper scale range for the measuring converter.

The invented range-switching device achieves rapid processing speed because the switching action is governed by the signal from the switching amplifier from the fast acting switching A/D converter, which is provided separately to the usual measuring A/D converter.

Furthermore, the cost is kept lower because the device utilizes a slower but lower cost integrating-type converter in the measuring A/D converter.

BRIEF DESCRIPTION OF THE DRAWINGS

FIG. 1 is a block diagram of a first preferred embodiment of this invention which utilizes a switching A/D converter in a light intensity meter circuitry.

FIG. 2 is a diagram to explain the response time difference between the conventional and the invented A/D converter used in the present invention.

FIG. 3 is a block diagram of a light intensity meter circuit using the conventional range-switching circuitry.

DETAILED DESCRIPTION OF THE PREFERRED EMBODIMENTS

Preferred embodiments of this invention are explained below in reference t the figures mentioned above.

FIG. 1 is a block diagram of a first preferred embodiment of this invention which utilizes a switching amplifier in a light intensity meter circuitry. The invented circuitry, shown in FIG. 1, differs from the conventional circuitry, shown in FIG. 3, in having a range-switching A/D converter which outputs a signal based on the data from a range-switching A/D converter 6, as well as the microprocessor 4 to control the amplification factor of the switching amplifier 2.

The switching converter 6 performs the conversion process faster than the measuring converter 3. The microprocessor 4a performs the same basic function as previously mentioned microprocessor 4, that is to alter the amplification factor of the switching amplifier 2 to control the observed signal level to fit within a scale range of a meter.

The above range-switching A/D converter 6 and the microprocessor 4a constitute the range-switching circuitry According to this light intensity meter, the observed analogue signal from the photoelectric component 1 is amplified by the switching amplifier 2, and the amplified signal is forwarded to both measuring converter 3 and to a switching converter 6.

When the analogue signal reaches the switching converter 6, the signal is converted into a digital signal, which is inputted into the microprocessor 4a. The microprocessor 4a then compares the inputted signal with the memory data in ROM, which define the upper and the lower limits of stored values within a scale, then determines the necessary value of amplification change required for the switching amplifier 2 . For example, if a value exceeding the upper limit of the input level of the measuring converter 3 is generated by the switching amplifier 2, then the microprocessor 4a outputs a command signal to reduce the amplification factor in accordance with the output of the switching converter 6. The switching amplifier reduces the output signal by the corresponding amount. At this point, if the magnitude of the signal reaching the measuring converter 3 still exceeds the level of said converter 3, then the above process is repeated. That is, the microprocessor 4a generates another signal to reduce the amplification factor for the switching amplifier 2 by a predetermined amount in order to accommodate the observed signal within a scale range. In this case, a switching converter 6, having a much higher processing speed than the measuring converter 3, is used. Therefore, the output level of the switching amplifier 2 needed to fit within a scale range of the measuring converter 3 can be determined quickly.

Furthermore, since the command actions are controlled by the dedicated switching converter 6, the measuring converter 3 similarly can be dedicated to the task of measuring. Therefore, the converter of choice in a circuit of this type is a slower performing but economical integrating-type converter.

FIG. 2 compares the performance times of the two devices, conventional and the invented auto-ranging devices; the conventional device is provided with a measuring A/D converter 3 (a 12-bit integrating-type A/D converter of 140 ms processing time) while the invented device is provided with a switching A/D converter (an 8-bit successive approximation-type converter of 0.1 ms processing time). As shown in this Figure, with four range-switching steps, the conventional range-switching device requires;

$$140 \text{ ms} \times 5 = 700 \text{ ms}$$

while the invented device requires $$0.1 \text{ ms} \times 4 + 140 \text{ ms} = 140.4 \text{ ms}.$$

It is clear that the measuring time is shorted by 559.6 ms by the use of the invented device.

In the above first preferred embodiment, a fast acting switching converter 6 was chosen but a second preferred embodiment includes a switching converter 6 having a lesser number of bits than that of the measuring converter 3. It is also possible to use a comparator in place of a switching A/D converter 6.

We claim:

1. An auto-ranging device comprising:
   a measuring A/D converter;
   a range-switching A/D converter having a faster processing speed than that of said measuring A/D converter and connected in parallel therewith;
   a range-switching amplifier receptive of an input signal for applying an output signal to the measuring A/D converter and the range-switching A/D converter and controllable to variably amplify the input signal to produce the output signal; and
   controlling means receptive of an output from said range-switching A/D converter to control the amplification by the range-switching amplifier to adjust the magnitude of said output signal such that when the magnitude of the output signal exceeds a scale range of said range switching A/D converter, said amplification is lowered and when the magnitude of the output signal is less than a scale range of said range switching A/D converter, said amplification is increased, whereby the adjusted output signal is measurable with a predetermined range of scale capabilities of said measuring A/D converter.

2. The auto-ranging device according to claim 1, wherein said measuring A/D converter comprises an integrating-type A/D converter and wherein said range-switching A/D converter comprises a successive approximation-type A/D converter.

3. The auto-ranging device according to claim 1, wherein said range-switching A/D converter comprises a converter having a lesser number of bits than that in said measuring A/D converter.

* * * * *